(12) United States Patent
Jo et al.

(10) Patent No.: US 12,029,095 B2
(45) Date of Patent: *Jul. 2, 2024

(54) DISPLAY DEVICE WITH INTEGRATED TOUCH SCREEN

(71) Applicant: LG Display Co., Ltd., Seoul (KR)

(72) Inventors: JungSik Jo, Paju-si (KR); JongGeun Yoon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/715,928

(22) Filed: Apr. 7, 2022

(65) Prior Publication Data

US 2022/0231091 A1 Jul. 21, 2022

Related U.S. Application Data

(63) Continuation of application No. 16/942,089, filed on Jul. 29, 2020, now Pat. No. 11,329,107, which is a
(Continued)

(30) Foreign Application Priority Data

Dec. 26, 2016 (KR) ........................ 10-2016-0178822

(51) Int. Cl.
*H10K 59/40* (2023.01)
*G06F 3/041* (2006.01)
(Continued)

(52) U.S. Cl.
CPC ........... *H10K 59/40* (2023.02); *G06F 3/0412* (2013.01); *G06F 3/0416* (2013.01); *G06F 3/044* (2013.01);
(Continued)

(58) Field of Classification Search
CPC . H01L 27/322; H01L 27/323; H01L 27/3246; H01L 27/3279; H01L 51/5253;
(Continued)

(56) References Cited

U.S. PATENT DOCUMENTS 6,888,606 B2  5/2005  Hinata et al.
9,577,014 B2  2/2017  Ishii et al.
(Continued)

FOREIGN PATENT DOCUMENTS

CN      102213852 A    10/2011
JP      2004-078138 A   3/2004
(Continued)

OTHER PUBLICATIONS

China National Intellectual Property Administration, Office Action, CN Patent Application No. 201710560696.7, Apr. 28, 2021, 18 pages.
(Continued)

*Primary Examiner* — Amr A Awad
*Assistant Examiner* — Aaron Midkiff
(74) *Attorney, Agent, or Firm* — Fenwick & West LLP

(57) ABSTRACT

Disclosed is a display device with integrated touch screen, which prevents external light from being reflected by touch electrodes without a polarizer. The display device includes an organic light emitting device layer disposed on a substrate, a plurality of color filters disposed on the organic light emitting device layer, a plurality of first touch electrodes and a plurality of second touch electrodes disposed on the plurality of color filters to overlap a boundary portion between the plurality of color filters, and a black matrix disposed on the plurality of first touch electrodes and the plurality of second touch electrodes to overlap the plurality of first touch electrodes and the plurality of second touch electrodes.

19 Claims, 10 Drawing Sheets

Related U.S. Application Data continuation of application No. 15/711,651, filed on Sep. 21, 2017, now Pat. No. 10,763,312.

(51) Int. Cl.

| | | |
|---|---|---|
| *G06F 3/044* | (2006.01) | |
| *H10K 50/844* | (2023.01) | |
| *H10K 50/86* | (2023.01) | |
| *H10K 59/122* | (2023.01) | |
| *H10K 59/38* | (2023.01) | |

(52) U.S. Cl.
CPC ......... *H10K 50/844* (2023.02); *H10K 50/865* (2023.02); *H10K 59/122* (2023.02); *H10K 59/38* (2023.02); *G06F 2203/04103* (2013.01); *G06F 2203/04111* (2013.01)

(58) Field of Classification Search
CPC ............ H01L 51/5256; H01L 51/5284; H01L 2251/5338; G06F 3/0412; G06F 3/044; G06F 3/0445; G06F 3/0446; G06F 2203/04102; G06F 2203/04111; G06F 2203/04112; G06F 3/0416; G06F 2203/04103; G06F 3/045; H10K 50/844; H10K 50/865; H10K 59/122; H10K 59/126; H10K 59/131; H10K 59/38; H10K 59/40; H10K 50/131

See application file for complete search history.

(56) References Cited

U.S. PATENT DOCUMENTS

| | | | |
|---|---|---|---|
| 10,763,312 B2* | 9/2020 | Jo | ............ G06F 3/0445 |
| 2002/0163614 A1 | 11/2002 | Hinata et al. | |
| 2003/0147115 A1 | 8/2003 | Takizawa et al. | |
| 2009/0135351 A1 | 5/2009 | Lyu et al. | |
| 2012/0199856 A1 | 8/2012 | Koresawa et al. | |
| 2013/0300989 A1 | 11/2013 | Hibayashi et al. | |
| 2014/0061597 A1* | 3/2014 | Choi | ............ H01L 51/003 257/40 |
| 2014/0353691 A1 | 12/2014 | Lee | |
| 2015/0060817 A1 | 3/2015 | Sato et al. | |
| 2015/0084907 A1 | 3/2015 | Burberry et al. | |
| 2015/0155347 A1* | 6/2015 | Baek | ............ H01L 51/5284 257/40 |
| 2015/0270319 A1 | 9/2015 | Ishii et al. | |
| 2015/0318514 A1* | 11/2015 | Kim | ............ G06F 3/0412 438/25 |
| 2015/0346866 A1 | 12/2015 | Kusunoki et al. | |
| 2015/0380467 A1 | 12/2015 | Su | |
| 2016/0013255 A1 | 1/2016 | Sato | |
| 2016/0103359 A1* | 4/2016 | Kimura | ............ G06F 3/042 349/33 |
| 2016/0282989 A1 | 9/2016 | Hirakata et al. | |
| 2016/0378224 A1* | 12/2016 | Kwon | ............ G06F 3/0445 345/174 |
| 2017/0059752 A1* | 3/2017 | Kwon | ............ G02B 5/201 |

FOREIGN PATENT DOCUMENTS

| | | |
|---|---|---|
| JP | 2009-104969 A | 5/2009 |
| JP | 2014-049436 A | 3/2014 |
| JP | 2015-005423 A | 1/2015 |
| JP | 2015-050245 A | 3/2015 |
| JP | 2015-185227 A | 10/2015 |
| JP | 2016-018759 A | 2/2016 |
| JP | 2016-110613 A | 6/2016 |
| JP | 2016-145922 A | 8/2016 |
| JP | 2016-181261 A | 10/2016 |
| KR | 10-2016-0081704 A | 7/2016 |

OTHER PUBLICATIONS

Japan Patent Office, Notice of Reasons for Refusal, JP Patent Application No. 2017-220773, Jun. 11, 2019, ten pages.
United States Office Action, U.S. Appl. No. 15/711,651, filed Sep. 6, 2019, 23 pages.
United States Office Action, U.S. Appl. No. 15/711,651, filed May 8, 2019, 21 pages.
United States Office Action, U.S. Appl. No. 15/711,651, filed Jan. 28, 2019, 20 pages.
United States Office Action, U.S. Appl. No. 16/942,089, filed Aug. 6, 2021, 16 pages.
Korean Intellectual Property Office, Office Action, Korean Patent Application No. 10-2016-0178822, Dec. 1, 2023, 13 pages.

* cited by examiner

DISPLAY DEVICE WITH INTEGRATED TOUCH SCREEN

CROSS-REFERENCE TO RELATED APPLICATIONS

This application is a continuation of U.S. patent application Ser. No. 16/942,089 filed on Jul. 29, 2020, which is a continuation of U.S. patent application Ser. No. 15/711,651 filed on Sep. 21, 2017 (now U.S. Pat. No. 10,763,312 issued on Sep. 1, 2020), which claims the benefit of the Korean Patent Application No. 10-2016-0178822 filed on Dec. 26, 2016, all of which are hereby incorporated by reference as if fully set forth herein.

BACKGROUND

Field of the Disclosure

The present disclosure relates to a display device with integrated touch screen.

Discussion of the Related Art

With the advancement of information-oriented society, various requirements for display devices for displaying an image are increasing. Therefore, various display devices such as liquid crystal display (LCD) devices, plasma display panels (PDPs), and organic light emitting display devices are being used recently. In such display devices, the organic light emitting display devices are driven with a low voltage and have characteristics such as thinness, an excellent viewing angle, a fast response speed, etc.

The organic light emitting display devices each include a plurality of pixels, each including an organic light emitting device, and a bank that divides the pixels for defining the pixels. The bank may act as a pixel defining layer. The organic light emitting device includes an anode electrode, a hole transporting layer, an organic light emitting layer, an electron transporting layer, and a cathode electrode. In this case, when a high-level voltage is applied to the anode electrode and a low-level voltage is applied to the cathode electrode, a hole and an electron move to the organic light emitting layer through the hole transporting layer and the electron transporting layer and are combined with each other in the organic light emitting layer to emit light.

In a case where the organic light emitting device emits white light, red, green, and blue color filters for realizing red, green, and blue and a black matrix for dividing the color filters are used. The organic light emitting device is provided on a lower substrate of the organic light emitting display device, and the color filters and the black matrix are provided on an upper substrate of the organic light emitting display device. Also, by using an adhesive layer, the lower substrate where the organic light emitting device is provided is bonded to the upper substrate where the color filters and the black matrix are provided.

A thickness of the organic light emitting display device is thickened by the adhesive layer, and for this reason, a distance between the organic light emitting device and the black matrix increases. For this reason, the organic light emitting display device has the following problems.

FIGS. 1A and 1B are exemplary diagrams illustrating a luminance viewing angle and occurrence of color mixture with respect to a distance between an organic light emitting device and a black matrix.

In FIG. 1A, when a distance between an organic light emitting layer OL of an organic light emitting device 2 and a black matrix BM is "a", occurrence of color mixture and a luminance viewing angle (i e, luminance viewing angle decrease) are shown due to the organic light emitting device 2. In FIG. 1B, when the distance between the organic light emitting layer OL of the organic light emitting device 2 and the black matrix BM is "b", occurrence of color mixture and a luminance viewing angle are not shown due to the organic light emitting device 2. The distance "a" is longer than the distance "b". The organic light emitting device 2 includes an anode electrode AND, an organic light emitting layer OL, and a cathode electrode CAT.

Referring to FIGS. 1A and 1B, when the distance between the organic light emitting layer OL of the organic light emitting device 2 and the black matrix BM is "a", color mixture where light emitted from the organic light emitting device 2 of one pixel travels to a color filter CF of an adjacent pixel without being blocked by the black matrix BM occurs. However, when the distance between the organic light emitting layer OL of the organic light emitting device 2 and the black matrix BM is "b", color mixture hardly occurs.

Moreover, when the distance between the organic light emitting layer OL of the organic light emitting device 2 and the black matrix BM is "a", light emitted from the organic light emitting device 2 is output at a first angle "θ1", but when the distance between the organic light emitting layer OL of the organic light emitting device 2 and the black matrix BM is "b", the light emitted from the organic light emitting device 2 is output at a second angle "θ2" greater than the first angle "θ1".

As described above, in order to prevent occurrence of color mixture and widen a luminance viewing angle, it is required to decrease the distance between the organic light emitting layer OL of the organic light emitting device 2 and the black matrix BM.

Recently, the organic light emitting display devices are implemented as a display device with integrated touch screen including a touch screen panel capable of sensing a touch of a user. In this case, the organic light emitting display devices function as a touch screen device.

In the display device with integrated touch screen, Tx electrodes and Rx electrodes are provided in the touch screen panel. Also, the display device with integrated touch screen includes a polarizer, for preventing image quality from being degraded because light incident from the outside is reflected by the Tx electrodes and the Rx electrodes. In this case, due to the polarizer, the display device with integrated touch screen of the related art has a problem where the cost increases and a thickness is thickened. Also, because external light is reflected by the polarizer, a screen looks like a mirror in the outdoors, and for this reason, the display device with integrated touch screen has another problem where image visibility is reduced in the outdoors.

SUMMARY

Accordingly, the present disclosure is directed to provide a display device with integrated touch screen that substantially obviates one or more problems due to limitations and disadvantages of the related art.

An aspect of the present disclosure is directed to provide a display device with integrated touch screen, which prevents external light from being reflected by touch electrodes without a polarizer.

Another aspect of the present disclosure is directed to provide a display device with integrated touch screen, in which a thickness is reduced despite including a color filter and a touch electrode.

Another aspect of the present disclosure is directed to provide a display device with integrated touch screen, in which a distance between an organic light emitting layer and a black matrix is reduced.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display device with integrated touch screen, the display device including an organic light emitting device layer disposed on a substrate, a plurality of color filters disposed on the organic light emitting device layer, a plurality of first touch electrodes and a plurality of second touch electrodes disposed on the plurality of color filters to overlap a boundary portion between the plurality of color filters, and a black matrix disposed on the plurality of first touch electrodes and the plurality of second touch electrodes to overlap the plurality of first touch electrodes and the plurality of second touch electrodes.

In another aspect of the present disclosure, there is provided a display device with integrated touch screen, the display device including an organic light emitting device layer disposed on a substrate, a plurality of color filters disposed on the organic light emitting device layer and including a first color filter including a first color material, a second color filter including a second color material, and a third color filter including a third color material, and a plurality of first touch electrodes and a plurality of second touch electrodes disposed on the plurality of color filters to overlap a boundary portion between the plurality of color filters. Two or more of the first to third color filters overlap each other in a boundary portion therebetween.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1A:
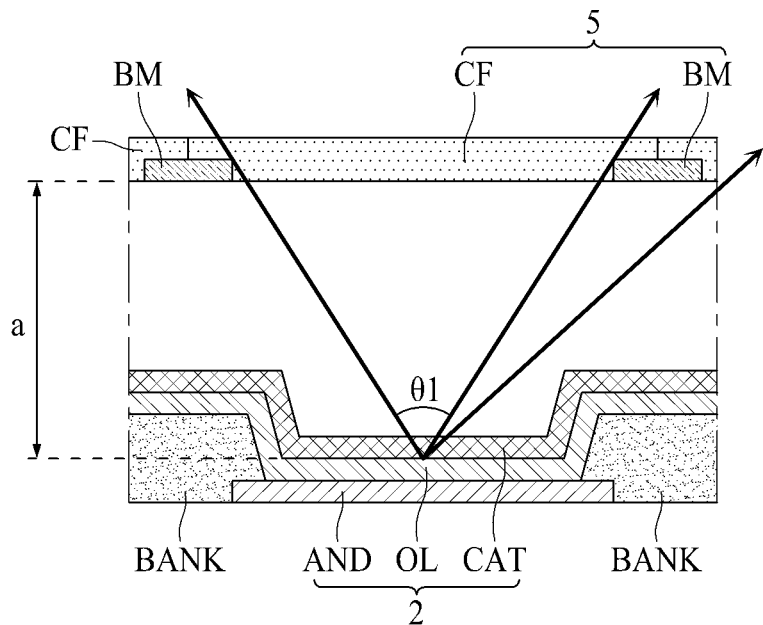
FIGS. 1A and 1B are exemplary diagrams illustrating a luminance viewing angle and occurrence of color mixture with respect to a distance between an organic light emitting device and a black matrix.
Figure 1B:
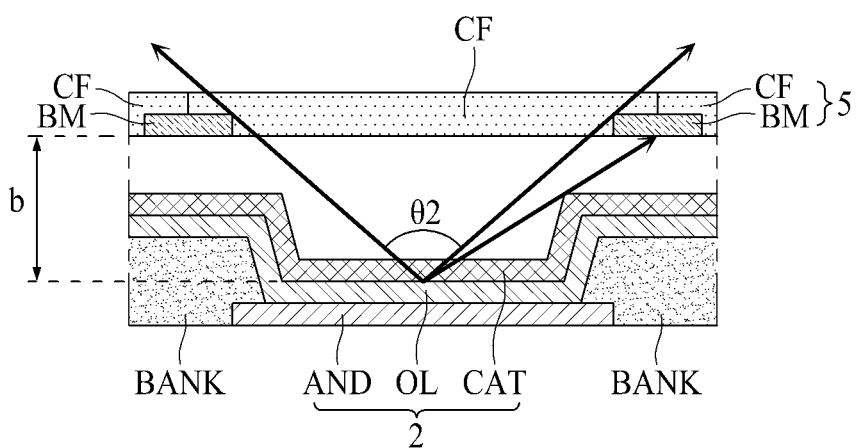

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where "comprise", "have", and "include" described in the present specification are used, another part may be added unless "only" is used. The terms of a singular form may include plural forms unless referred to the contrary.

In construing an element, the element is construed as including an error range although there is no explicit description.

In describing a position relationship, for example, when a position relation between two parts is described as "on", "over", "under", and "next", one or more other parts may be disposed between the two parts unless "just" or "direct" is used.

In describing a time relationship, for example, when the temporal order is described as "after", "subsequent", "next", and "before", a case which is not continuous may be included unless "just" or "direct" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is strictly vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

Figure 2:
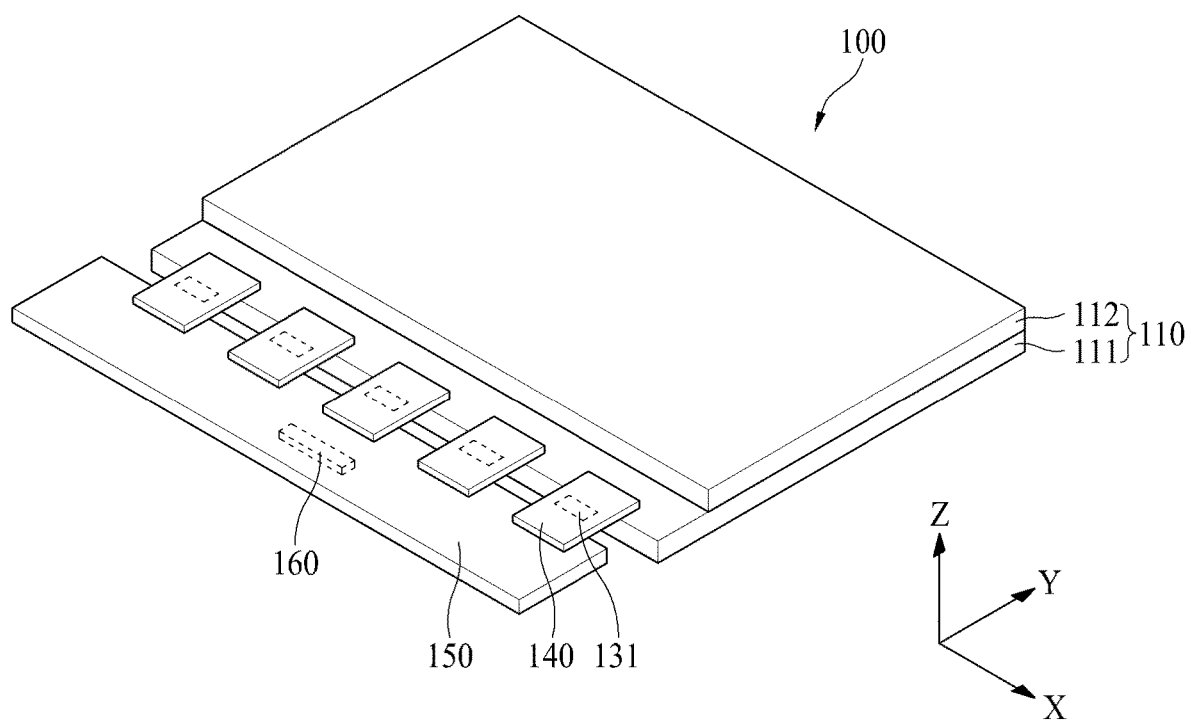
FIG. 2 is a perspective view illustrating a display device with integrated touch screen according to an embodiment of the present disclosure.
Figure 3:
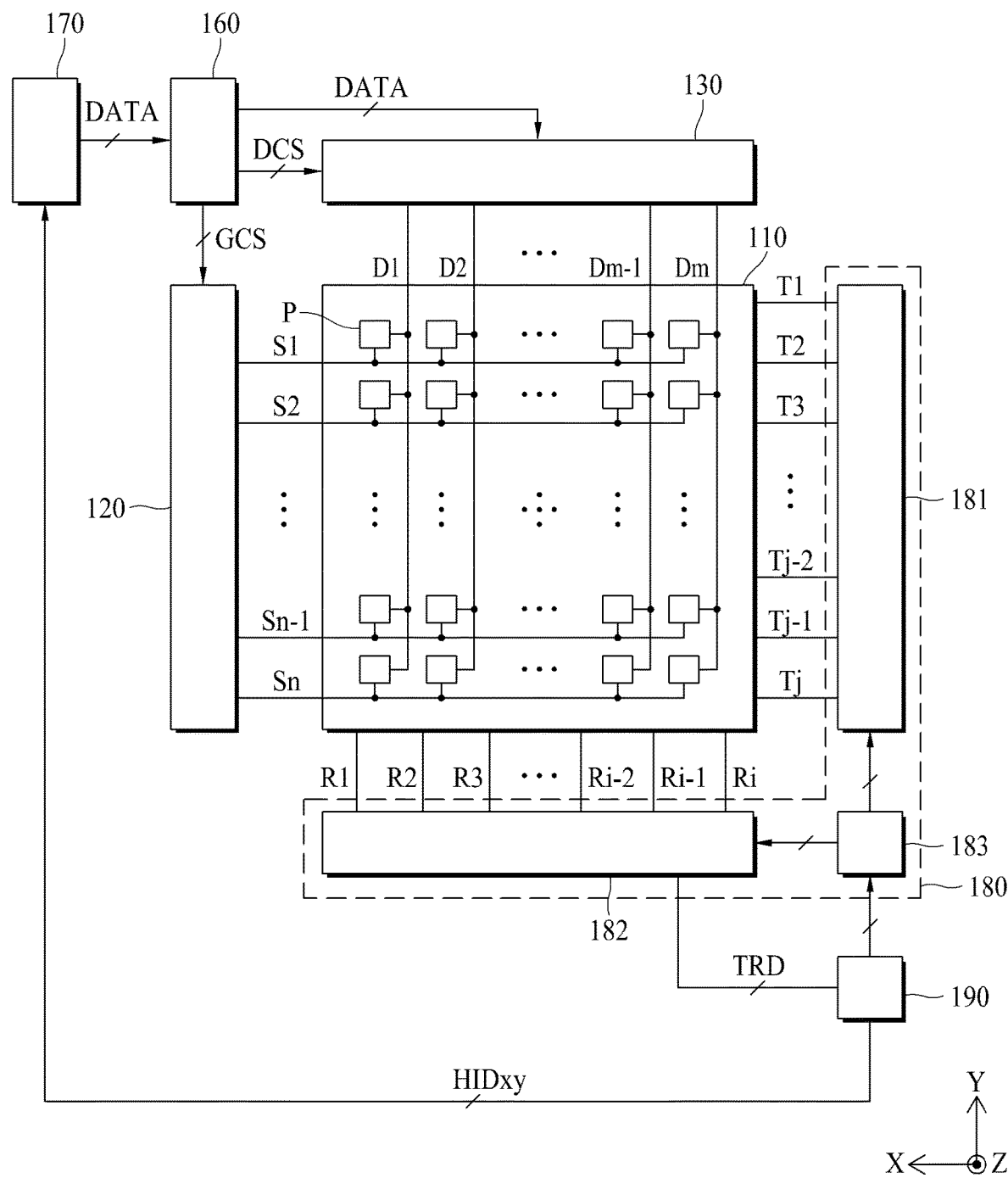
FIG. 3 is a block diagram illustrating a display device with integrated touch screen according to an embodiment of the present disclosure.

FIG. 2 is a perspective view illustrating a display device with integrated touch screen according to an embodiment of the present disclosure. FIG. 3 is a block diagram illustrating a display device with integrated touch screen according to an embodiment of the present disclosure.

Referring to FIGS. 2 and 3, the display device with integrated touch screen according to an embodiment of the present disclosure may include a display panel 110, a scan driver 120, a data driver 130, a timing controller 160, a host system 170, a touch driver 180, and a touch coordinate calculator 190.

The display device with integrated touch screen according to an embodiment of the present disclosure may be implemented as a flat panel display device such as an LCD device, a field emission display (FED) device, a PDP, an organic light emitting display device, an electrophoresis (EPD) device, or the like. In this disclosure below, an example where the display device with integrated touch screen according to an embodiment of the present disclosure is implemented as an organic light emitting display device will be described, but the present embodiment is not limited thereto.

The display panel 110 may include a first substrate 111 and a second substrate 112. The second substrate 112 may be an encapsulation substrate. The first substrate 111 may be a plastic film, a glass substrate, or the like. The second substrate 112 may be a plastic film, a glass substrate, an encapsulation film (a protective film), or the like.

The display panel 110 may include a display area where a plurality of pixels P are provided to display an image. A plurality of data lines D1 to Dm (where m is a positive integer equal to or more than two) and a plurality of scan lines S1 to Sn (where n is a positive integer equal to or more than two) may be arranged in the display panel 110. The data lines D1 to Dm and the scan lines S1 to Sn may be arranged to intersect each other. The pixels P may be respectively provided in a plurality of pixel areas defined by an intersection structure of the data lines and the scan lines.

Each of the pixels P of the display panel 110 may be connected to one of the data lines D1 to Dm and one of the scan lines S1 to Sn. Each of the pixels P of the display panel 110 may include a driving transistor which controls a drain-source current according to a data voltage applied to a gate electrode of the driving transistor, a scan transistor which is turned on by a scan signal of a corresponding scan line and supplies a data voltage of a corresponding data line to the gate electrode of the driving transistor, an organic light emitting diode (OLED) which emits light according to the drain-source current of the driving transistor, and a capacitor which stores a voltage of the gate electrode of the driving transistor. Therefore, each of the pixels P may emit light according to a current supplied to the OLED.

The scan driver 120 may receive a scan control signal GCS from the timing controller 160. The scan driver 120 may respectively supply scan signals to the scan lines S1 to Sn according to the scan control signal GCS.

The scan driver 120 may be provided in a non-display area outside one side or each of both sides of the display area of the display panel 110 in a gate driver in panel (GIP) type. Alternatively, the scan driver 120 may be manufactured as a driving chip, mounted on a flexible film, and attached on the non-display area outside the one side or each of the both sides of the display area of the display panel 110 in a tape automated bonding (TAB) type.

The data driver 130 may receive digital video data DATA and a data control signal DCS from the timing controller 160. The data driver 130 may convert the digital video data DATA into analog positive/negative data voltages according to the data control signal DCS and may respectively supply the data voltages to the data lines. That is, pixels to which the data voltages are to be supplied may be selected by the scan signals of the scan driver 120, and the data voltages may be supplied to the selected pixels.

The data driver 130, as illustrated in FIG. 2, may include a plurality of source drive ICs 131. Each of the plurality of source drive ICs 131 may be mounted on a flexible film 140 in a chip-on film (COF) type or a chip-on plastic (COP) type. The flexible film 140 may be attached on pads provided in the non-display area of the display panel 110 by using an anisotropic conducting film, and thus, the source drive ICs 131 may be connected to the pads.

The flexible film 140 may be provided in plurality, and a circuit board 150 may be attached on the plurality of flexible films 140. A plurality of circuits which are implemented as a plurality of driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data DATA and timing signals from the host system 170. The timing signals may include a vertical synchronization signal, a horizontal synchronization signal, a data enable signal, a dot clock, etc. The vertical synchronization signal may be a signal that defines one frame period. The horizontal synchronization signal may be a signal that defines one horizontal period necessary for supplying data voltages to pixels of one horizontal line of the display panel 110. The data enable signal may be a signal that defines a period where valid data is input. The dot clock may be a signal that is repeated at a certain short period.

The timing controller 160 may generate the data control signal DCS for controlling an operation timing of the data driver 130 and the scan control signal GCS for controlling an operation timing of the scan driver 120 based on the timing signals, for the operation timing of each of the scan driver 120 and the data driver 130. The timing controller 160 may output the scan control signal GCS to the scan driver 120 and may output the digital video data DATA and the data control signal DCS to the data driver 130.

The host system 170 may be implemented as a navigation system, a set-top box, a DVD player, a blue-ray player, a personal computer (PC), a home theater system, a broadcasting receiver, a phone system, or the like. The host system 170 may include a system-on chip (SoC) with a built-in scaler and may convert the digital video data DATA of an input image into a format suitable for displaying the image on the display panel 110. The host system 170 may transmit the digital video data DATA and the timing signals to the timing controller 160.

In addition to the data lines D1 to Dm and the scan lines S1 to Sn, a plurality of first and second touch electrodes may be provided in the display panel 110. The first touch electrodes may be provided to intersect the second touch electrodes. The first touch electrodes may be connected to a first touch driver 181 through a plurality of first touch lines T1 to Tj (where j is a positive integer equal to or more than two). The second touch electrodes may be connected to a second touch driver 182 through a plurality of second touch lines R1 to Ri (where i is a positive integer equal to or more than two). A plurality of touch sensors may be respectively provided in intersection portions of the first touch electrodes and the second touch electrodes. In an embodiment of the present disclosure, each of the touch sensors is exemplarily implemented with a mutual capacitor, but is not limited thereto. The first and second touch electrodes will be described later in detail with reference to FIG. 5.

The touch driver 180 may supply a driving pulse to the first touch electrodes through the first touch line T1 to Tj and may sense charging variation amounts of the touch sensors through the second touch lines R1 to Ri. That is, in FIG. 3, it is described that the first touch line T1 to Tj are Tx lines through which the driving pulse is supplied, and the second touch lines R1 to Ri are Rx lines through which the charging variation amounts of the touch sensors are respectively sensed.

The touch driver 180 may include a first touch driver 181, a second touch driver 182, and a touch controller 183. The first touch driver 181, the second touch driver 182, and the touch controller 183 may be integrated into one readout integrated chip (ROIC).

The first touch driver 181 may select a first touch line, through which the driving pulse is to be output, according to control by the touch controller 183 and may supply the driving pulse to the selected first touch line. For example, the driving pulse may be provided in plurality, and the first touch driver 181 may sequentially supply the driving pulses to the first touch lines T1 to Tj.

The second touch driver 182 may select second touch lines, through which charging variation amounts of touch sensors are to be received, according to control by the touch controller 183 and may receive the charging variation amounts of the touch sensors through the selected second touch lines. The second touch driver 182 may sample the charging variation amounts of the touch sensors received through the second touch lines R1 to Ri to convert the charging variation amounts into touch raw data TRD which are digital data.

The touch controller 183 may generate a Tx setup signal for setting a first touch line, to which the driving pulse is to be output from the first touch driver 181, and an Rx setup signal for setting a second touch line through which a touch sensor voltage is to be received from the second touch driver 182. Also, the touch controller 183 may generate timing control signals for controlling the operation timings of the first touch driver 181 and the second touch driver 182.

The touch coordinate calculator 190 may receive the touch raw data TRD from the touch driver 180. The touch coordinate calculator 190 may calculate touch coordinates, based on a touch coordinate calculation method and may output touch coordinate data HIDxy, including information about the touch coordinates, to the host system 170.

The touch coordinate calculator 190 may be implemented with a micro controller unit (MCU). The host system 170 may analyze the touch coordinate data HIDxy input from the touch coordinate calculator 190 to execute an application program associated with coordinates where a touch has been performed by a user. The host system 170 may transmit the digital video data DATA and the timing signals to the timing controller 160 according to the executed application program.

The touch driver 180 may be included in the source drive ICs 131, or may be manufactured as a separate driving chip and mounted on the circuit board 150. Also, the touch coordinate calculator 190 may be manufactured as a separate driving chip and mounted on the circuit board 150.

Figure 4:
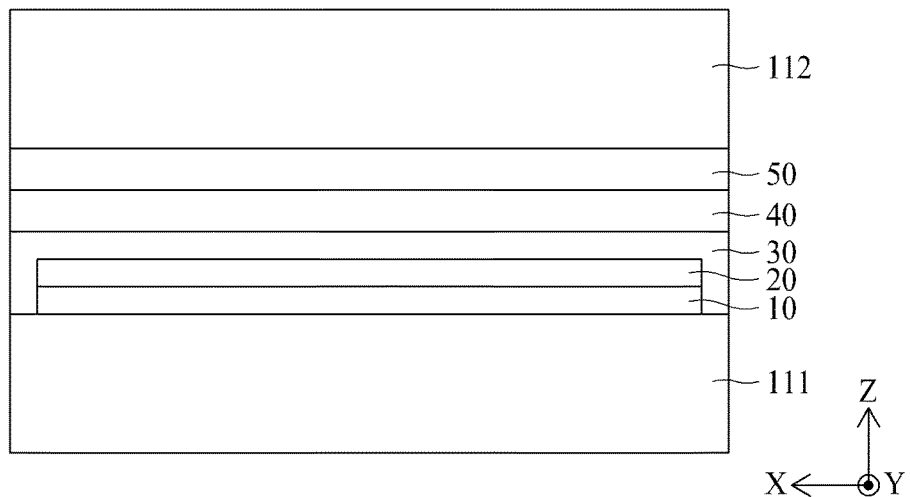
FIG. 4 is a cross-sectional view schematically illustrating one side of a display panel of FIG. 2.

FIG. 4 is a cross-sectional view schematically illustrating one side of the display panel 110 of FIG. 2.

Referring to FIG. 4, the display panel 110 may include a first substrate 111, a second substrate 112, and a thin film transistor (TFT) layer 10, an organic light emitting device layer 20, an encapsulation layer 30, a color filter layer 40, and a touch sensing layer 50 disposed between the first and second substrates 111 and 112.

The first substrate 111 may be a plastic film, a glass substrate, or the like.

The TFT layer 10 may be formed on the first substrate 111. The TFT layer 10 may include the scan lines, the data lines, and a plurality of TFTs. The TFTs may each include a gate electrode, a semiconductor layer, a source electrode, and a drain electrode. In case where the scan driver is provided in the GIP type, the scan driver may be provided along with the TFT layers 10.

The organic light emitting device layer 20 may be formed on the TFT layer 10. The organic light emitting device layer 20 may include a first electrode, an organic light emitting layer, a second electrode, and a bank. The organic light emitting layer may include a hole transporting layer, a light emitting layer, and an electron transporting layer. In this case, when a voltage is applied to the first electrode and the second electrode, a hole and an electron move to the light emitting layer through the hole transporting layer and the electron transporting layer and are combined with each other in the light emitting layer to emit light. Since the pixels are provided in an area where the organic light emitting device layer 20 is formed, the area where the organic light emitting device layer 20 is formed may be defined as a display area. A peripheral area of the display area may be defined as a non-display area.

The encapsulation layer 30 may be formed on the organic light emitting device layer 20. The encapsulation layer 30 prevents oxygen or water from penetrating into the organic light emitting device layer 20. The encapsulation layer 30 may include at least one inorganic layer.

The color filter layer 40 may be formed on the encapsulation layer 30. The color filter layer 40 may include a plurality of color filters having different transmissive wavelength ranges. In this case, the plurality of color filters may be arranged to respectively correspond to a plurality of pixels provided in the organic light emitting device layer 20.

The touch sensing layer 50 may be formed on the color filter layer 40. The touch sensing layer 50 may include first and second touch electrodes for sensing a user touch. Also, the touch sensing layer 50 may further include a black matrix disposed on the first and second touch electrodes, for preventing light incident from the outside from being reflected by the first and second touch electrodes. A plane structure of the touch sensing layer 50 will be described below with reference to FIG. 5. Also, a cross-sectional structure of the touch sensing layer 50 will be described below in detail with reference to FIGS. 6 and 7.

The second substrate 112 may be provided on the touch sensing layer 50. The second substrate 112 may act as a cover substrate or a cover window which covers the first substrate 111. The second substrate 112 may be a plastic film, a glass substrate, an encapsulation film (a protective film), or the like, but is not limited thereto. In other embodiments, the second substrate 112 may be an optical film such as an OLED transmittance controllable film (OTF).

Figure 5:
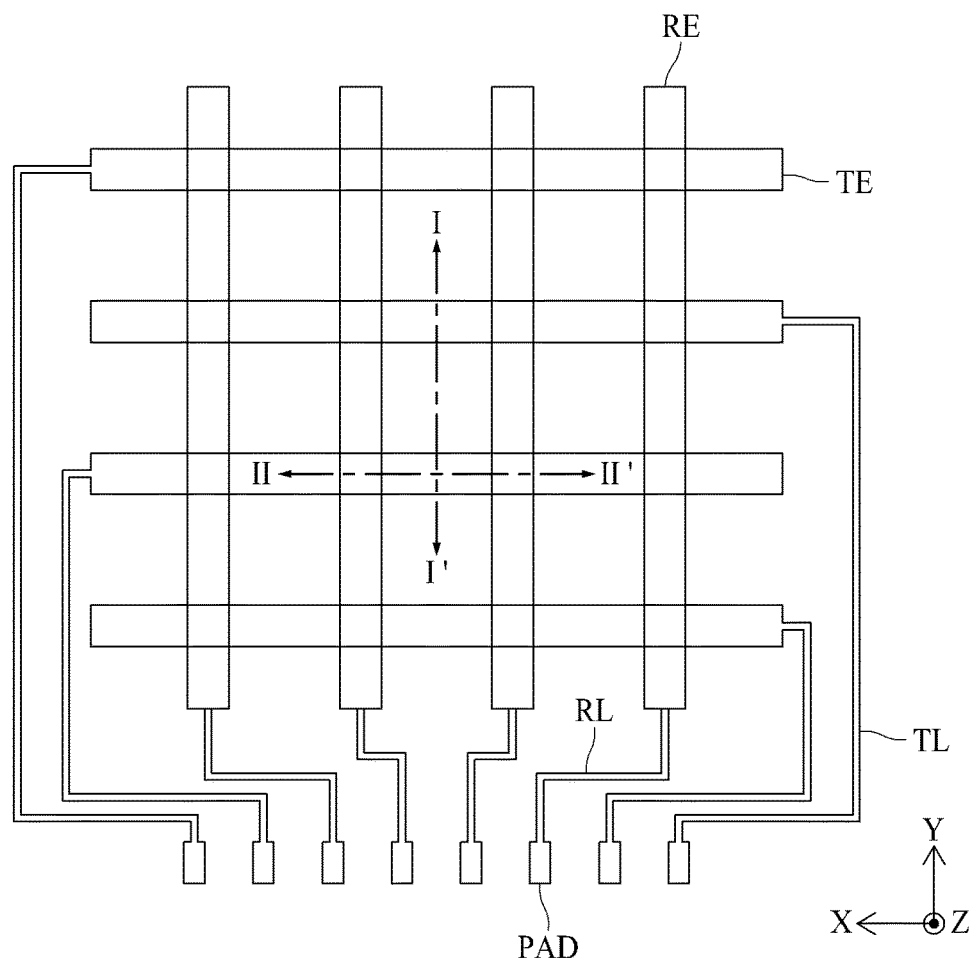
FIG. 5 is a plan view illustrating an example of a touch sensing layer of FIG. 4.

FIG. 5 is a plan view illustrating an example of the touch sensing layer 50 of FIG. 4.

Referring to FIG. 5, the touch sensing layer 50 may include a plurality of first touch electrodes TE and a plurality of second touch electrodes RE. The first touch electrodes TE may extend in a first direction (an X-axis direction) and may have a line shape, and the second touch electrodes RE may extend in a second direction (a Y-axis direction) and may have a line shape. The first direction (the X-axis direction) may be a direction parallel to the scan lines S1 to Sn, and the second direction (the Y-axis direction) may be a direction parallel to the data lines D1 to Dm. Alternatively, the first direction (the X-axis direction) may be a direction parallel to the data lines D1 to Dm, and the second direction (the Y-axis direction) may be a direction parallel to the scan lines S1 to Sn.

An insulation layer may be disposed between the first touch electrodes TE and the second touch electrodes RE to electrically insulate the first touch electrodes TE from the second touch electrodes RE. Also, each of first touch electrodes TE extending in the first direction may be electrically insulated from first touch electrodes TE adjacent thereto in the second direction. Each of second touch electrodes RE extending in the second direction may be electrically insulated from second touch electrodes RE adjacent thereto in the first direction.

Therefore, a mutual capacitor corresponding to a touch sensor may be provided in an intersection area of the first touch electrode TE and the second touch electrode RE.

The first touch electrodes TE extending in the first direction may be connected to a first touch line TL at one end thereof. The first touch line TL may be connected to the first touch driver 181 through a pad. Therefore, the first touch electrodes TE may receive the driving pulse from the first touch driver 181 through the first touch line TL.

The second touch electrodes RE extending in the second direction may be connected to a second touch line RL at one end thereof. The second touch line RL may be connected to the second touch driver 182 through the pad. Therefore, the second touch driver 182 may receive charging variation amounts of touch sensors from the second touch electrodes RE.

First Embodiment

Figure 6:
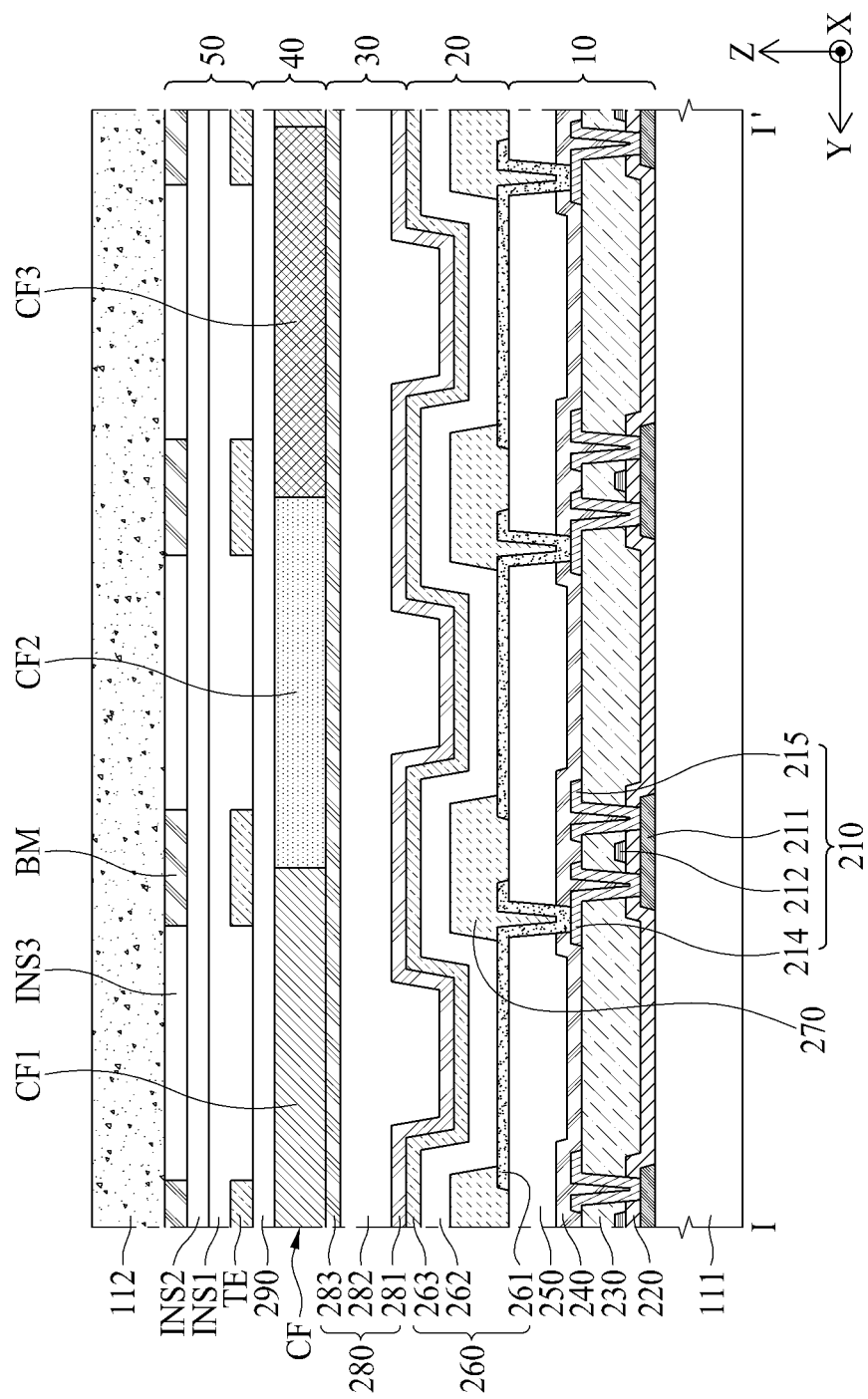
FIG. 6 is a cross-sectional view illustrating an embodiment taken along line I-I' of FIG. 5.
Figure 7:
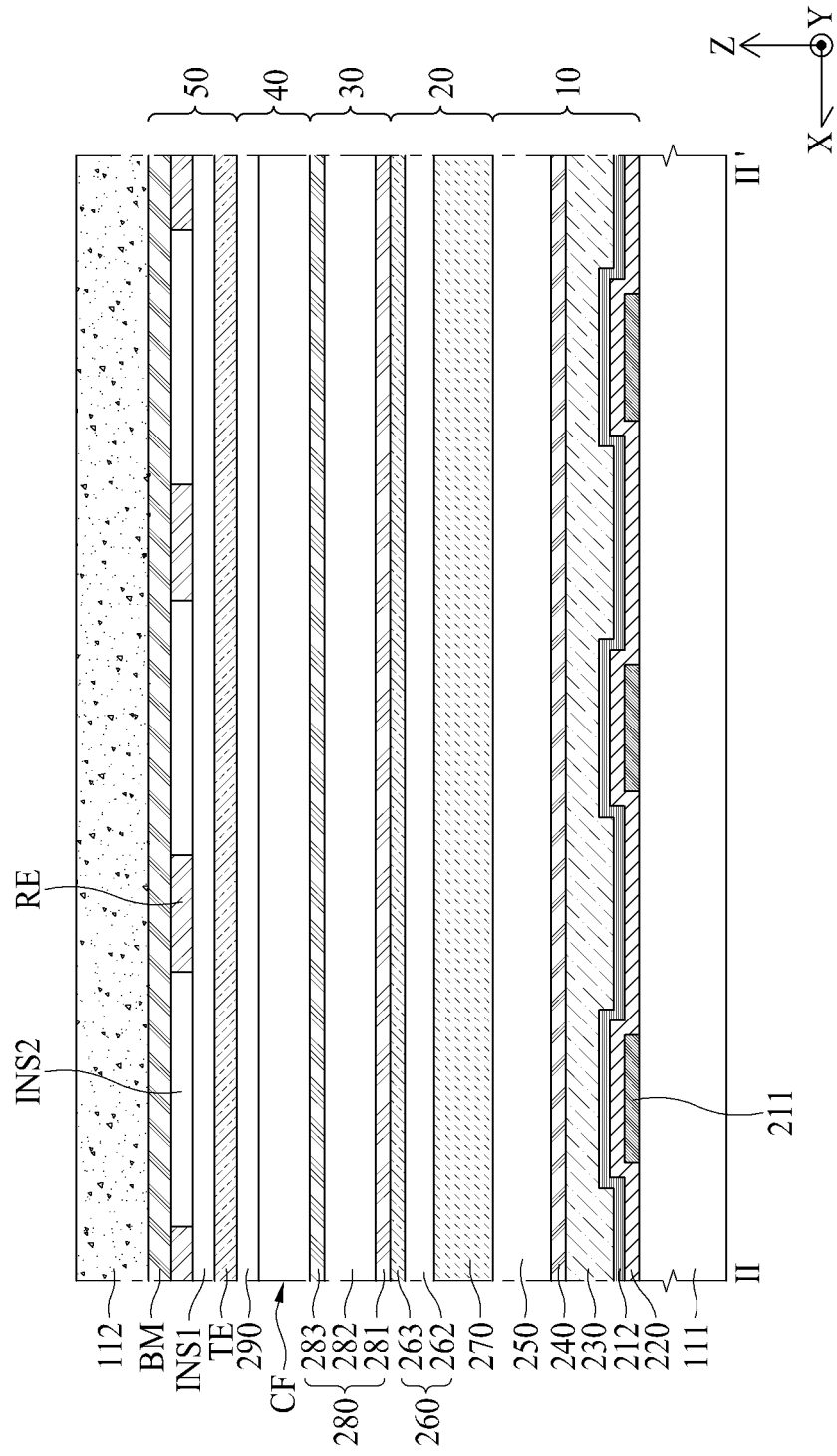
FIG. 7 is a cross-sectional view illustrating an embodiment taken along line II-II' of FIG. 5.

FIG. 6 is a cross-sectional view illustrating an embodiment taken along line I-I' of FIG. 5, and FIG. 7 is a cross-sectional view illustrating an embodiment taken along line II-II' of FIG. 5.

Referring to FIGS. 6 and 7, a TFT layer 10 may be formed on a first substrate 111. The TFT layer 10 may include a plurality of TFTs 210, a gate insulation layer 220, an interlayer insulation layer 230, a passivation layer 240, and a planarization layer 250.

A buffer layer may be formed on one surface of the first substrate 111. The buffer layer may be formed on the one surface of the first substrate 111, for protecting the TFTs 210 and a plurality of organic light emitting devices 260 from water penetrating through the first substrate 111 vulnerable to penetration of water. The one surface of the first substrate 111 may be a surface facing the second substrate 112. The buffer layer may be formed of a plurality of inorganic layers which are alternately stacked. For example, the buffer layer may be formed of a multilayer where one or more inorganic layers of silicon oxide (SiOx), silicon nitride (SiNx), and SiON are alternately stacked. The buffer layer may be omitted.

The TFTs 210 may be formed on the buffer layer. The TFTs 210 may each include an active layer 211, a gate electrode 212, a source electrode 214, and a drain electrode 215. In FIG. 6, the TFTs 210 are exemplarily illustrated as being formed in a top gate type where the gate electrode 212 is disposed on the active layer 211, but is not limited thereto. That is, the TFTs 210 may be formed in a bottom gate type where the gate electrode 212 is disposed under the active layer 211 or a double gate type where the gate electrode 212 is disposed both on and under the active layer 211.

The active layer 211 may be formed on the buffer layer. The active layer 211 may be formed of a silicon-based semiconductor material, an oxide-based semiconductor material, and/or the like. A light blocking layer (not shown) for blocking external light incident on the active layer 211 may be formed between the buffer layer and the active layer 211.

The gate insulation layer 220 may be formed on the active layer 211. The gate insulation layer 220 may be formed of an inorganic layer, and for example, may be formed of silicon oxide (SiOx), silicon nitride (SiNx), or a multilayer thereof.

The gate electrode 212 and a gate line may be formed on the gate insulation layer 220. The gate electrode 212 and the gate line may each be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

The interlayer insulation layer 230 may be formed on the gate electrode 212 and the gate line. The interlayer insulation layer 230 may be formed of an inorganic layer, and for example, may be formed of SiOx, SiNx, or a multilayer thereof.

The source electrode 214, the drain electrode 215, and a data line may be formed on the interlayer insulation layer 230. Each of the source electrode 214 and the drain electrode 215 may contact the active layer 211 through a contact hole which passes through the gate insulation layer 220 and the interlayer insulation layer 230. The source electrode 214, the drain electrode 215, and the data line may each be formed of a single layer or a multilayer which includes one of Mo, Al, Cr, Au, Ti, Ni, Nd, and Cu, or an alloy thereof.

The passivation layer 240 for insulating the TFT 210 may be formed on the source electrode 214, the drain electrode 215, and the data line. The passivation layer 240 may be formed of an inorganic layer, and for example, may be formed of SiOx, SiNx, or a multilayer thereof.

The planarization layer 250 for planarizing a step height caused by the TFT 210 may be formed on the passivation layer 240. The planarization layer 250 may be formed of an organic layer such as acryl resin, epoxy resin, phenolic resin, polyamide resin, polyimide resin, and/or the like.

The organic light emitting device layer 20 may be formed on the TFT layer 10. The organic light emitting device layer 20 may include the organic light emitting devices 260 and a bank 270.

The organic light emitting devices 260 and the bank 270 may be formed on the planarization layer 250. The organic light emitting devices 260 may each include a first electrode 261, an organic light emitting layer 262, and a second electrode 263. The first electrode 261 may be an anode electrode, and the second electrode 263 may be a cathode electrode.

The first electrode 261 may be formed on the planarization layer 250. The first electrode 261 may be connected to the source electrode 214 of the TFT 210 through a contact hole which passes through the passivation layer 240 and the planarization layer 250. The first electrode 261 may be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

The bank 270 may be formed on the planarization layer 250 to cover an edge of the first electrode 261, for dividing a plurality of pixels P1 to P3. That is, the bank 270 may act as a pixel defining layer that defines the pixels P1 to P3.

Each of the pixels P1 to P3 may denote an area where a first electrode corresponding to an anode electrode, an organic light emitting layer, and a second electrode corresponding to a cathode electrode are sequentially stacked, and a hole from the first electrode and an electron from the second electrode are combined with each other in the organic light emitting layer to emit light. In this case, a first pixel P1 may be defined as a red subpixel, a second pixel P2 may be defined as a green subpixel, and a third pixel P3 may be defined as a blue subpixel. Also, the first to third pixels P1 to P3 may be defined as one unit pixel. However, an embodiment of the present disclosure is not limited thereto, and a white subpixel may be additionally defined.

The bank 270 may be formed of an organic layer such as acryl resin, epoxy resin, phenolic resin, polyamide resin, polyimide resin, and/or the like.

The bank 270 may be a black bank. The black bank may be formed of a light absorbing material or may be doped with a light absorbing agent, thereby absorbing light incident from the outside. The black bank may be disposed to overlap a black matrix BM to be described below. In this case, the black bank may have a width which is equal to or greater than that of the black matrix BM, and may absorb light which flows in without being absorbed by the black matrix BM. The black bank may be formed of a black-based material, and for example, may include a carbon-based black pigment.

The organic light emitting layer 262 may be formed on the first electrode 261 and the bank 270. The organic light emitting layer 262 may be a common layer which is formed in the pixels P1 to P3 in common, and may be a white light emitting layer which emits white light. In this case, the organic light emitting layer 262 may be formed in a tandem structure including two or more stacks. Each of the stacks may include a hole transporting layer, at least one light emitting layer, and an electron transporting layer.

In FIGS. 6 and 7, the organic light emitting layer 262 is illustrated as a common layer which is formed in the pixels P1 to P3 in common, but is not limited thereto. In another embodiment, the organic light emitting layer 262 may include a red light emitting layer emitting red light, a green light emitting layer emitting green light, and a blue light emitting layer emitting blue light. The red light emitting layer may be formed on the first electrode 261 of the first pixel P1. The green light emitting layer may be formed on the first electrode 261 of the second pixel P2. The blue light emitting layer may be formed on the first electrode 261 of the third pixel P3. In this case, each of the red light emitting layer, the green light emitting layer, and the blue light emitting layer may be deposited by using a fine metal mask (FMM).

The second electrode 263 may be formed on the organic light emitting layer 262. The second electrode 263 may be formed to cover the organic light emitting layer 262. The second electrode 263 may be a common layer which is formed in a plurality of pixels such as red subpixel, green subpixel, blue subpixel and white subpixel in common.

The second electrode 263 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. If the second electrode 263 is formed of a semi-transmissive conductive material, emission efficiency is enhanced by a micro-cavity. A capping layer may be formed on the second electrode 263.

The encapsulation layer 30 may be formed on the organic light emitting device layer 20. The encapsulation layer 30 may include an encapsulation film 280.

In detail, the encapsulation film 280 may be disposed on the second electrode 263. The encapsulation film 280 prevents oxygen or water from penetrating into the organic light emitting layer 262 and the second electrode 263. To this end, the encapsulation film 280 may include at least one inorganic film and at least one organic film. For example, the encapsulation film 280 may include a first inorganic film 281, an organic film 282, and a second inorganic film 283.

The first inorganic film 281 may be disposed on the second electrode 263. The first inorganic film 281 may be formed to cover the second electrode 263. The organic film 282 may be disposed on the first inorganic film 281. The organic film 282 may be formed to a sufficient thickness, for preventing particles from penetrating into the organic light emitting layer 262 and the second electrode 263 via the first inorganic film 281. The organic film 282 may be blocked by a dam (not shown) so as not to cover a pad. The second inorganic film 283 may be disposed on the organic film 282. The second inorganic film 283 may be formed to cover the organic film 282.

Each of the first and second inorganic films 281 and 283 may be formed of silicon nitride, aluminum nitride, zirconium nitride, titanium nitride, hafnium nitride, tantalum nitride, silicon oxide, aluminum oxide, titanium oxide, and/or the like. The organic film 282 may be formed of acryl resin, epoxy resin, phenolic resin, polyamide resin, polyimide resin, and/or the like.

A color filter layer 40 may be formed on the encapsulation layer 30. The color filter layer 40 may include first to third color filters CF1 to CF3 including different color materials from each other and an overcoat layer 290.

In detail, the first to third color filters CF1 to CF3 having different transmissive wavelength ranges may be disposed on the encapsulation film 280. The first color filter CF1 may be a red color filter disposed in correspondence with the first pixel P1, the second color filter CF2 may be a green color filter disposed in correspondence with the second pixel P2, and the third color filter CF3 may be a blue color filter disposed in correspondence with the third pixel P3. In this case, the first color filter CF1 may be formed of an organic layer including a red pigment, the second color filter CF2 may be formed of an organic layer including a green pigment, and the third color filter CF3 may be formed of an organic layer including a blue pigment.

Although not shown, the color filter layer 40 may further include a transparent organic layer disposed in correspondence with a white subpixel. In this case, the transparent organic layer may be formed of acryl resin, epoxy resin, phenolic resin, polyamide resin, polyimide resin, and/or the like.

The overcoat layer 290 may be formed on the first to third color filters CF1 to CF3. The overcoat layer 290 may be disposed on the first to third color filters CF1 to CF3 to planarize a step height between the first to third color filters CF1 to CF3.

The touch sensing layer 50 may be formed on the color filter layer 40. The touch sensing layer 50 may include a plurality of first touch electrodes TE, a plurality of second touch electrodes RE, a black matrix BM, a first insulation layer INS1, a second insulation layer INS2, and a third insulation layer INS3.

The first touch electrodes TE may be directly formed on a top of the color filter layer 40. The first touch electrodes TE may be arranged to overlap a boundary portion between the first to third color filters CF1 to CF3 in the first direction (the X-axis direction). The first touch electrodes TE may be formed of a transparent metal material such as ITO, IZO, or the like, or may be formed of a metal material such as Al, AlNd, Mo, MoTi, Cu, Cr, Ag, or an Ag-based alloy.

The first insulation layer INS1 may be formed to cover the first touch electrodes TE. In this case, the first insulation layer INS1 may be disposed between the first touch electrodes TE. The first touch electrodes TE may be insulated from each other by the first insulation layer INS1. Also, the first insulation layer INS1 may be disposed on the first touch electrodes TE. The first insulation layer INS1 may be formed of an inorganic layer, and for example, may be formed of SiOx, SiNx, or a multilayer thereof.

The second touch electrodes RE may be formed on the first insulation layer INS1. The second touch electrodes RE may be arranged to overlap the boundary portion between the first to third color filters CF1 to CF3 in the second direction (the Y-axis direction). Also, the second touch electrodes RE may be insulated from the first touch electrodes TE by the first insulation layer INS1. The second touch electrodes RE may be formed of a transparent metal material such as ITO, IZO, or the like, or may be formed of a metal material such as Al, AlNd, Mo, MoTi, Cu, Cr, Ag, or an Ag-based alloy.

The second insulation layer INS2 may be formed to cover the second touch electrodes RE. In this case, the second insulation layer INS2 may be disposed between the second touch electrodes RE. The second touch electrodes RE may be insulated from each other by the second insulation layer INS2. Also, the second insulation layer INS2 may be disposed on the second touch electrodes RE. The second insulation layer INS2 may be formed of an inorganic layer, and for example, may be formed of SiOx, SiNx, or a multilayer thereof. In FIGS. 6 and 7, the second insulation layer INS2 is illustrated, but the second insulation layer INS2 may be omitted.

The first touch line TL may extend from the first touch electrode TE, and the second touch line RL may extend from the second touch electrode RE. Each of the first and second touch lines TL and RL may extend to a non-display area and may be connected to a pad in the non-display area.

The black matrix BM may be formed on the second insulation layer INS2. The black matrix BM may be disposed to overlap the first touch electrodes TE in the first direction (the X-axis direction). Also, the black matrix BM may be disposed to overlap the second touch electrodes RE in the second direction (the Y-axis direction). In this manner, the black matrix BM may be disposed to overlap the first and second touch electrodes TE and RE, thereby preventing light incident from the outside from being reflected by the first and second touch electrodes TE and RE. Also, the black matrix BM may be disposed to overlap the boundary portion between the first to third color filters CF1 to CF3, thereby preventing color mixture from occurring in adjacent pixels.

The black matrix BM may be formed of an organic layer including a carbon-based black pigment. Alternatively, the black matrix BM may be formed of an opaque metal material such as chromium (Cr), molybdenum (Mo), an alloy (MoTi) of Mo and Ti, tungsten (W), vanadium (V), niobium (Nb), tantalum (Ta), manganese (Mn), cobalt (Co), nickel (Ni), or the like which is high in a light absorption rate.

The third insulation layer INS3 may be formed to cover the black matrix BM. In this case, the third insulation layer INS3 may be formed of an inorganic layer, and for example, may be formed of SiOx, SiNx, or a multilayer thereof. In FIG. 6, the third insulation layer INS3 is illustrated, but the third insulation layer INS3 may be omitted.

According to the embodiments of the present disclosure, since the color filter layer 40 may be directly formed on the encapsulation layer 30 and the touch sensing layer 50 may be directly formed on the color filter layer 40, alignment is not needed in bonding the first substrate 111 to the second substrate 112, and a separate adhesive layer is not needed. Accordingly, according to the embodiments of the present disclosure, a thickness of a device is reduced.

Moreover, according to the embodiments of the present disclosure, since the color filter layer 40 instead of the touch sensing layer 50 is first formed on the encapsulation layer 30, a distance between the organic light emitting layer 262 and each of the first to third color filters CF1 to CF3 is reduced. Accordingly, according to the embodiments of the present disclosure, a luminance viewing angle and a color viewing angle are improved.

Moreover, according to the embodiments of the present disclosure, since the black matrix BM is disposed on the first and second touch electrodes TE and RE, the black matrix BM prevents light, which is incident from the outside, from being reflected by the first and second touch electrodes TE and RE. Accordingly, according to the embodiments of the present disclosure, reflection of external light is blocked even without including a separate polarizer, thereby reducing the manufacturing cost and decreasing a thickness of a device.

Moreover, according to the embodiments of the present disclosure, since the touch sensing layer 50 is disposed on the color filter layer 40, distances between the first and second touch electrodes TE and RE of the touch sensing layer 50 and the first and second electrodes 261 and 263 of the organic light emitting device layer 20 are secured. Accordingly, according to the embodiments of the present disclosure, noise caused by parasitic capacitors between the first and second touch electrodes TE and RE of the touch sensing layer 50 and the first and second electrodes 261 and 263 of the organic light emitting device layer 20 is reduced.

Second Embodiment

Figure 8:
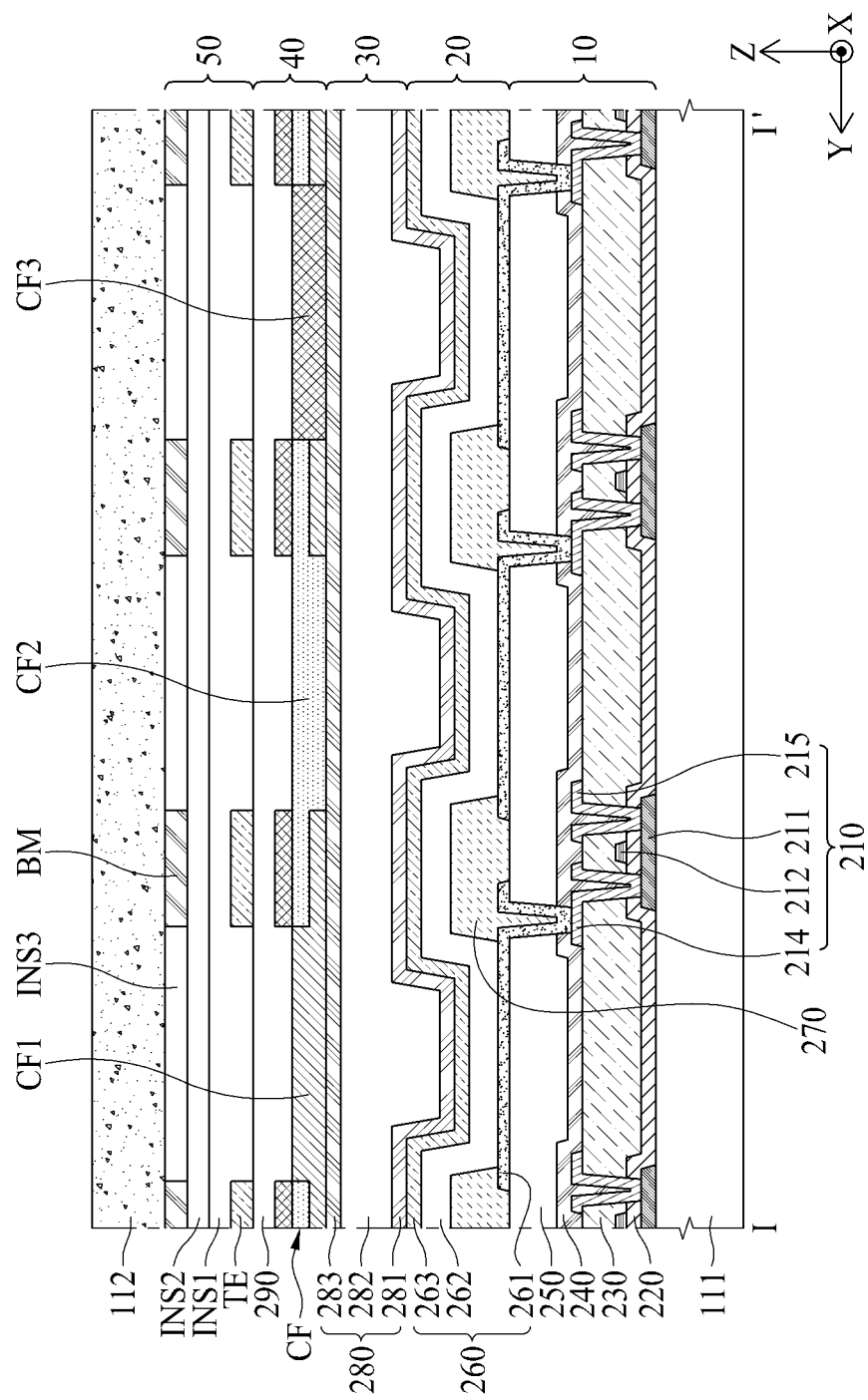
FIG. 8 is a cross-sectional view illustrating another embodiment taken along line I-I' of FIG. 5.

FIG. 8 is a cross-sectional view illustrating another embodiment taken along line I-I' of FIG. 5.

Except that first to third color filters CF1 to CF3 overlap each other in a boundary portion therebetween, a display device with integrated touch screen illustrated in FIG. 8 is substantially the same as the details described above with reference to FIGS. 6 and 7. Therefore, detailed descriptions on the first substrate 111, the second substrate 112, the TFT layer 10, the organic light emitting device layer 20, the encapsulation layer 30, and the touch sensing layer 50 illustrated in FIGS. 6 and 7 are omitted.

A color filter layer 40 may be formed on the encapsulation layer 30. The color filter layer 40 may include first to third color filters CF1 to CF3 and an overcoat layer 290.

In detail, the first to third color filters CF1 to CF3 having different transmissive wavelength ranges may be disposed on the encapsulation film 280. The first color filter CF1 may be a red color filter disposed in correspondence with a first pixel P1, the second color filter CF2 may be a green color filter disposed in correspondence with a second pixel P2, and the third color filter CF3 may be a blue color filter disposed in correspondence with a third pixel P3. In this case, the first color filter CF1 may be formed of an organic layer including a red pigment, the second color filter CF2 may be formed of an organic layer including a green pigment, and the third color filter CF3 may be formed of an organic layer including a blue pigment.

The first to third color filters CF1 to CF3 may be disposed to overlap each other in an area (i.e., a boundary portion) overlapping a bank 270. As illustrated in FIG. 8, the first to third color filters CF1 to CF3 may be sequentially stacked on a boundary portion between first to third color filters CF1 to CF3. In this case, the stacking order of the first to third color filters CF1 to CF3 stacked on the boundary portion may be relevant to an order in which the first to third color filters CF1 to CF3 are formed. For example, if the color filter layer 40 is formed in the order of the first color filter CF1, the second color filter CF2, and the third color filter CF3, the first to third color filters CF1 to CF3 may be formed to overlap each other in the boundary portion between the first to third color filters CF1 to CF3 in the order of the first color filter CF1, the second color filter CF2, and the third color filter CF3.

In FIG. 8, it is illustrated that all of the first to third color filters CH to CF3 overlap each other in the boundary portion between the first to third color filters CF1 to CF3, but the present embodiment is not limited thereto. In other embodiments, two adjacent color filters may overlap each other in the boundary portion between the first to third color filters CF1 to CF3. For example, the first color filter CF1 and the second color filter CF2 may be formed to overlap each other in a boundary portion between the first color filter CF1 and the second color filter CF2, and the third color filter CF3 may not overlap.

As described above, two or more of the first to third color filters CF1 to CF3 may be disposed to overlap each other in the boundary portion between the first to third color filters CF1 to CF3, thereby effectively preventing color mixture which occurs when light emitted from one pixel travels to a color filter of an adjacent pixel.

To provide description for example, if the first color filter CF1 transmitting red light and the second color filter CF2 transmitting green light overlap each other in the boundary portion between the first color filter CF1 and the second color filter CF2, the red light passing through the first color filter CF1 cannot pass through the second color filter CF2. Accordingly, light emitted from the first pixel P1 cannot travel to the second pixel P2, and thus, light emitted from the second pixel P2 cannot travel to the first pixel P1.

Although not shown, the color filter layer 40 may further include a transparent organic layer disposed in correspondence with a white subpixel. In this case, the transparent organic layer may be formed of acryl resin, epoxy resin, phenolic resin, polyamide resin, polyimide resin, and/or the like.

An overcoat layer 290 may be formed on the first to third color filters CF1 to CF3. The overcoat layer 290 may be disposed on the first to third color filters CF1 to CF3 to planarize a step height between the first to third color filters CF1 to CF3.

According to the present embodiment, two or more of the first to third color filters CF1 to CF3 may be disposed to overlap each other in the boundary portion between the first to third color filters CF1 to CF3, thereby effectively preventing color mixture which occurs when light emitted from one pixel travels to a color filter of an adjacent pixel.

Moreover, according to the embodiments of the present disclosure, two or more of the first to third color filters CF1 to CF3 are merely formed to overlap each other without forming a separate pattern for preventing color mixture in the boundary portion between the first to third color filters, but it is expected to prevent occurrence of color mixture. Accordingly, according to the embodiments of the present disclosure, it is not required to add a separate manufacturing process.

Third Embodiment

Figure 9:
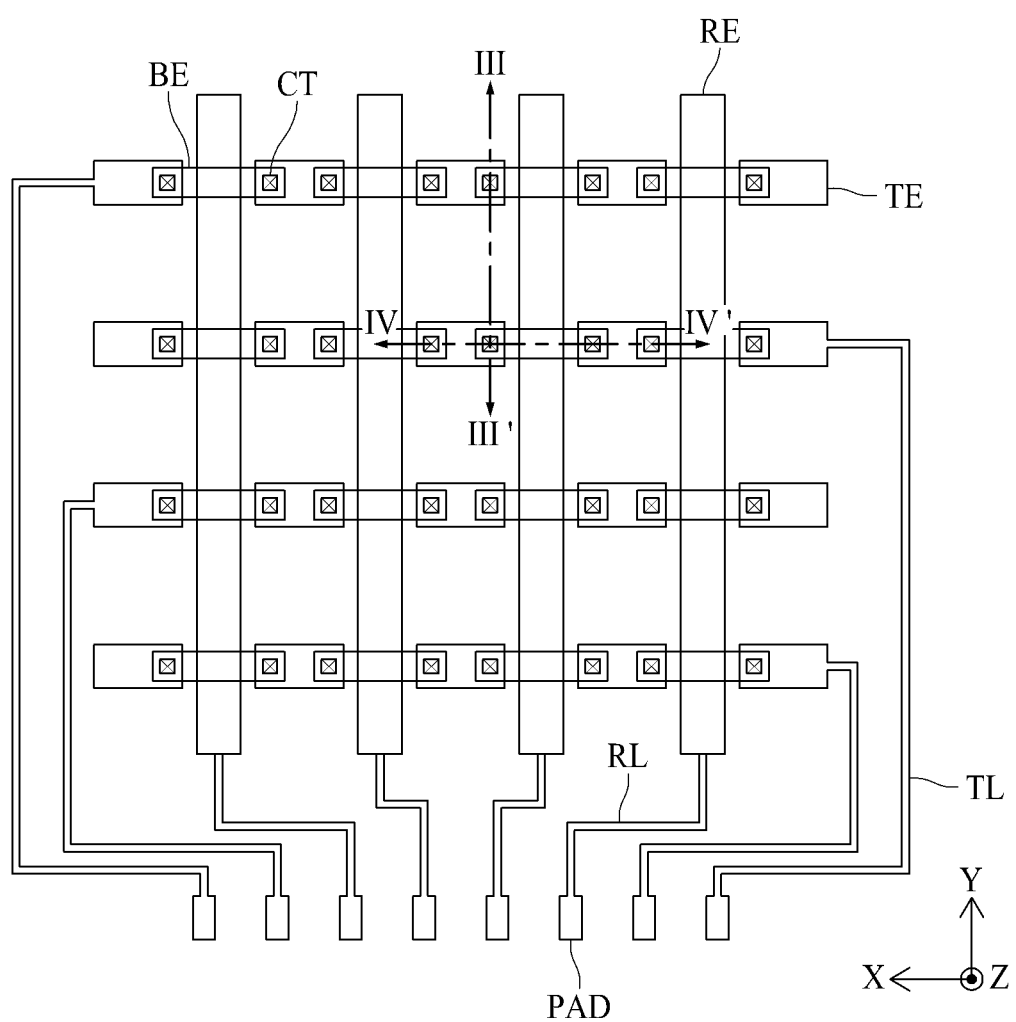
FIG. 9 is a plan view illustrating another example of a touch sensing layer of FIG. 4.
Figure 10:
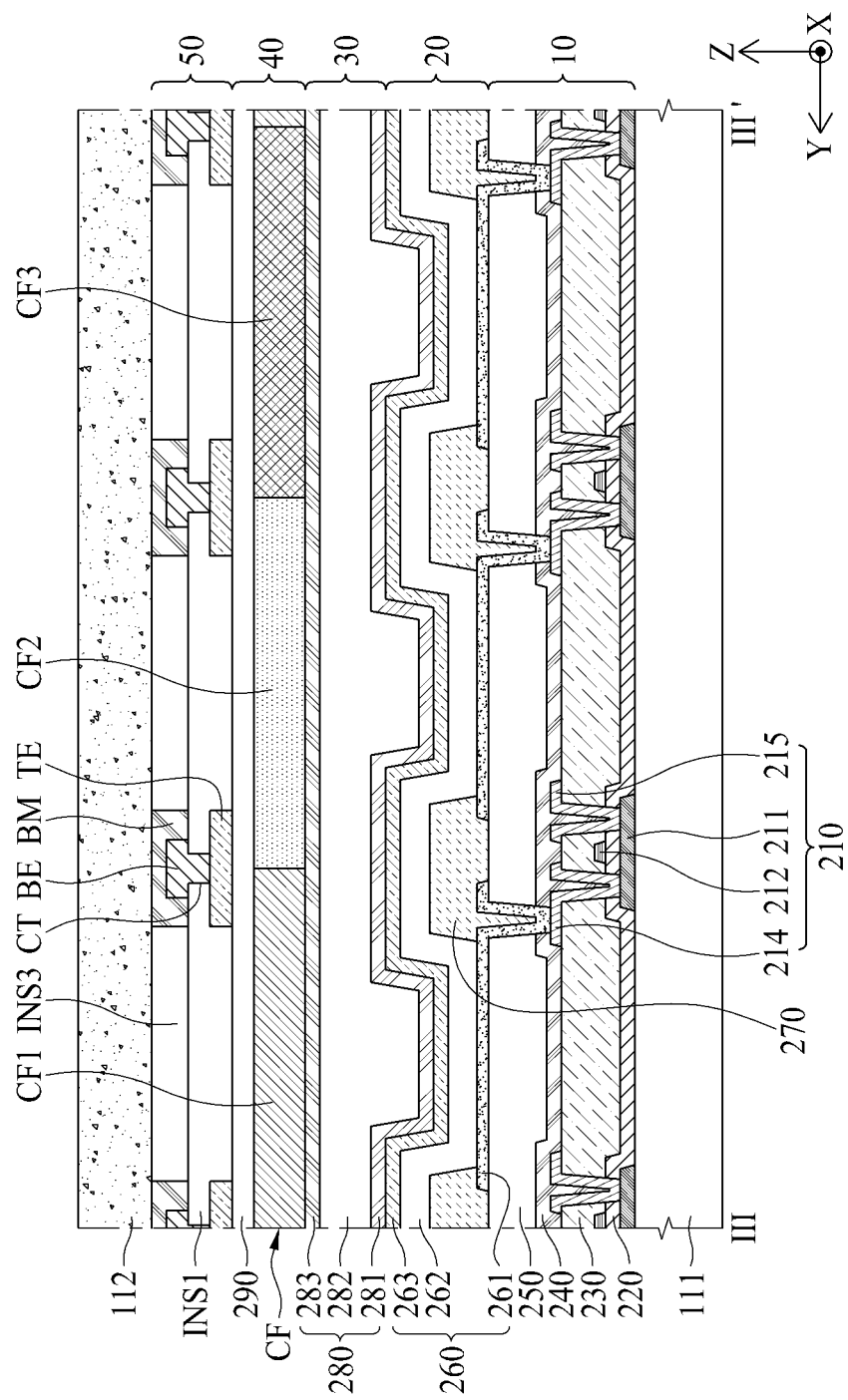
FIG. 10 is a cross-sectional view illustrating an embodiment taken along line of FIG. 9.
Figure 11:
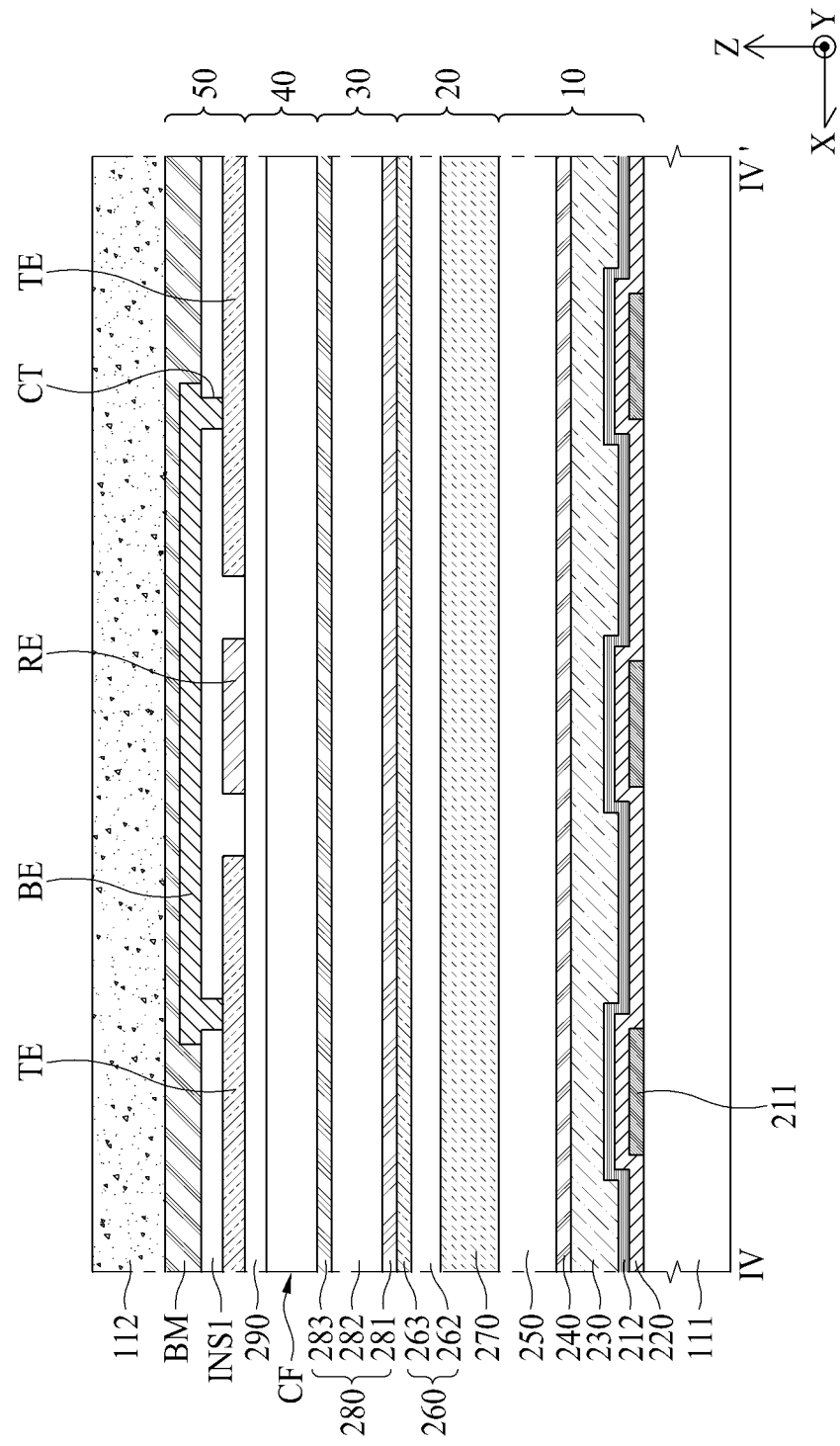
FIG. 11 is a cross-sectional view illustrating an embodiment taken along line IV-IV' of FIG. 9.

FIG. 9 is a plan view illustrating another example of the touch sensing layer 50 of FIG. 4. FIG. 10 is a cross-sectional view illustrating an embodiment taken along line of FIG. 9; and FIG. 11 is a cross-sectional view illustrating an embodiment taken along line IV-IV' of FIG. 9.

Referring to FIG. 9, the touch sensing layer 50 may include a plurality of first touch electrodes TE, a plurality of second touch electrodes RE, and a bridge electrode BE. The first touch electrodes TE may be arranged in a first direction (an X-axis direction) and connected to each other, and the second touch electrodes RE may be arranged in a second direction (a Y-axis direction) and connected to each other. The first direction (the X-axis direction) may be a direction parallel to the scan lines S1 to Sn, and the second direction (the Y-axis direction) may be a direction parallel to the data lines D1 to Dm. Alternatively, the first direction (the X-axis direction) may be a direction parallel to the data lines D1 to Dm, and the second direction (the Y-axis direction) may be a direction parallel to the scan lines S1 to Sn.

In order to prevent the first touch electrodes TE and the second touch electrodes RE from being short-circuited in intersection areas therebetween, the first touch electrodes TE which are adjacent to each other in the first direction may be electrically connected to each other through the bridge electrodes BE. The bridge electrodes BE may be disposed on a layer different from a layer on which the first and second touch electrodes TE and RE are disposed, and may be connected to, through contact portions CT, the first touch electrodes TE adjacent to each other. The bridge electrodes BE may intersect the second touch electrodes RE.

Each of first touch electrodes TE connected to each other in the first direction may be electrically insulated from first touch electrodes TE adjacent thereto in the second direction. Each of second touch electrodes RE connected to each other in the second direction may be electrically insulated from second touch electrodes RE adjacent thereto in the first direction.

Therefore, a mutual capacitor corresponding to a touch sensor may be provided in an intersection area of the first touch electrode TE and the second touch electrode RE.

The first touch electrodes TE connected to each other in the first direction may be connected to a first touch line TL at one end thereof. The first touch line TL may be connected to the first touch driver 181 through a pad. Therefore, the first touch electrodes TE may receive the driving pulse from the first touch driver 181 through the first touch line TL.

The second touch electrodes RE connected to each other in the second direction may be connected to a second touch line RL at one end thereof. The second touch line RL may be connected to the second touch driver 182 through the pad. Therefore, the second touch driver 182 may receive charging variation amounts of touch sensors of the second touch electrodes RE.

Except that the first touch electrodes TE are connected to each other through the bridge electrode BE, a display device with integrated touch screen illustrated in FIGS. 10 and 11 is substantially the same as the details described above with reference to FIGS. 6 and 7. Therefore, detailed descriptions on the first substrate 111, the second substrate 112, the TFT layer 10, the organic light emitting device layer 20, the encapsulation layer 30, and the color filter layer 40 illustrated in FIGS. 6 and 7 are omitted.

The touch sensing layer 50 may be formed on the color filter layer 40. The touch sensing layer 50 may include a plurality of first touch electrodes TE, a plurality of second touch electrodes RE, a plurality of bridge electrodes BE, a black matrix BM, a first insulation layer INS1, and a third insulation layer INS3.

The first touch electrodes TE and the second touch electrodes RE may be directly formed on a top of the color filter layer 40. The first touch electrodes TE may be arranged to overlap a boundary portion between first to third color filters CF1 to CF3 in the first direction (the X-axis direction). The second touch electrodes RE may be arranged to overlap the boundary portion between the first to third color filters CF1 to CF3 in the second direction (the Y-axis direction). The first touch electrodes TE and the second touch electrodes RE may each be formed of a transparent metal material such as ITO, IZO, or the like, or may be formed of a metal material such as Al, AlNd, Mo, MoTi, Cu, Cr, Ag, or an Ag-based alloy.

The first touch electrodes TE, the second touch electrodes RE, the first touch lines TL, and the second touch lines RL may be disposed on the same layer. The first insulation layer INS1 may be disposed to cover the first touch electrodes TE, the second touch electrodes RE, the first touch lines TL, and the second touch lines RL. In this case, the first insulation layer INS1 may be disposed between each of the first touch electrodes TE and each of the second touch electrodes RE. Each of the first touch electrodes TE may be insulated from each of the second touch electrodes RE by the first insulation layer INS1. Also, the first insulation layer INS1 may be disposed on the first touch electrodes TE and the second touch electrodes RE. The second touch electrodes RE may be insulated from the bridge electrodes BE by the first insulation layer INS1. The first insulation layer INS1 may be formed of an inorganic layer, and for example, may be formed of SiOx, SiNx, or a multilayer thereof.

The first touch line TL may extend from the first touch electrode TE, and the second touch line RL may extend from the second touch electrode RE. Each of the first and second touch lines TL and RL may extend to a non-display area and may be connected to a pad in the non-display area.

The bridge electrodes BE may be connected to adjacent first touch electrodes TE through contact portions CT, respectively. The bridge electrode BE may intersect the second touch electrode RE. In this case, the contact portions CT may be formed to pass through the first insulation layer INS1.

The black matrix BM may be formed on the first insulation layer INS1 and the bridge electrodes BE. The black matrix BM may be disposed to overlap the first touch electrodes TE and the bridge electrodes BE in the first direction (the X-axis direction). Also, the black matrix BM may be disposed to overlap the second touch electrodes RE in the second direction (the Y-axis direction). In this manner, the black matrix BM may be disposed to overlap the first and second touch electrodes TE and RE and the bridge electrodes BE, thereby preventing light incident from the outside from being reflected by the first and second touch electrodes TE and RE and the bridge electrodes BE. Also, the black matrix BM may be disposed to overlap the boundary portion between the first to third color filters CF1 to CF3, thereby preventing color mixture from occurring in adjacent pixels.

The black matrix BM may be formed of an organic layer including a carbon-based black pigment. Alternatively, the black matrix BM may be formed of an opaque metal material such as chromium (Cr), molybdenum (Mo), an alloy (MoTi) of Mo and Ti, tungsten (W), vanadium (V), niobium (Nb), tantalum (Ta), manganese (Mn), cobalt (Co), nickel (Ni), or the like which is high in a light absorption rate.

The third insulation layer INS3 may be formed to cover the black matrix BM. In this case, the third insulation layer INS3 may be formed of an inorganic layer, and for example, may be formed of SiOx, SiNx, or a multilayer thereof. In FIG. 10, the third insulation layer INS3 is illustrated, but the third insulation layer INS3 may be omitted.

According to the present embodiment, the first and second touch electrodes TE and RE may be formed on the same layer, thereby reducing a thickness of the touch sensing layer 50.

According to the embodiments of the present disclosure, since the color filter layer may be directly formed on the encapsulation layer and the touch sensing layer may be directly formed on the color filter layer, alignment is not needed in bonding the first substrate to the second substrate, and a separate adhesive layer is not needed. Accordingly, according to the embodiments of the present disclosure, a thickness of a device is reduced.

Moreover, according to the embodiments of the present disclosure, since the color filter layer instead of the touch sensing layer is first formed on the encapsulation layer, a distance between the organic light emitting layer and each of the color filters is reduced. Accordingly, according to the embodiments of the present disclosure, a luminance viewing angle and a color viewing angle are improved.

Moreover, according to the embodiments of the present disclosure, since the black matrix is disposed on the first and second touch electrodes, the black matrix prevents light, which is incident from the outside, from being reflected by the first and second touch electrodes. Accordingly, according to the embodiments of the present disclosure, reflection of external light is blocked even without including a separate polarizer, thereby reducing the manufacturing cost and decreasing a thickness of a device.

Moreover, according to the embodiments of the present disclosure, since the touch sensing layer is disposed on the color filter layer, distances between the first and second touch electrodes of the touch sensing layer and the first and second electrodes of the organic light emitting device layer are secured. Accordingly, according to the embodiments of the present disclosure, noise caused by parasitic capacitors between the first and second touch electrodes of the touch sensing layer and the first and second electrodes of the organic light emitting device layer is reduced.

Moreover, according to the embodiments of the present disclosure, two or more color filters may be disposed to overlap each other in a boundary portion between the first to third color filters, thereby effectively preventing color mixture which occurs when light emitted from one pixel travels to a color filter of an adjacent pixel.

Moreover, according to the embodiments of the present disclosure, two or more of the first to third color filters are merely formed to overlap each other without forming a separate pattern for preventing color mixture in the boundary portion between the first to third color filters, but it is expected to prevent occurrence of color mixture. Accordingly, according to the embodiments of the present disclosure, it is not required to add a separate manufacturing process.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display device comprising:
    a light emitting device layer on a substrate, the light emitting device layer including a first electrode, a light emitting layer on the first electrode and a bank, and a second electrode on the light emitting layer, the bank dividing the first electrode on the substrate;
    an encapsulation layer on the light emitting device layer, the encapsulation layer including at least one inorganic film;
    a plurality of color filters on the encapsulation layer;
    a plurality of first touch electrodes and a plurality of second touch electrodes on the plurality of color filters, the plurality of first touch electrodes and the plurality of second touch electrodes overlapping a boundary portion between the plurality of color filters; and
    a black matrix on one of the plurality of first touch electrodes and the plurality of second touch electrodes, the black matrix overlapping the bank,
    wherein the plurality of color filters and the black matrix are spaced apart from each other,
    wherein the plurality of color filters are disposed on a layer different from the plurality of first touch electrodes with at least an insulating layer interposed therebetween and the plurality of first touch electrodes are disposed on another layer different from the black matrix with at least another insulating layer interposed therebetween such that the plurality of first touch electrodes and the plurality of second touch electrodes are between the plurality of color filters and the black matrix in a cross-section view of the display device.

2. The display device of claim 1, wherein the plurality of color filters comprise a first color filter including a first color material, a second color filter including a second color material, and a third color filter including a third color material.

3. The display device of claim 2, wherein two adjacent color filters of the first to the third color filters overlap each other in a boundary portion therebetween.

4. The display device of claim 2, wherein all of the first to the third color filters overlap each other in a boundary portion therebetween.

5. The display device of claim 1, wherein the bank comprises a light absorbing material and the black matrix overlaps the plurality of first touch electrodes and the plurality of second touch electrodes.

6. The display device of claim 5, wherein the plurality of color filters are disposed to overlap each other in an area overlapping the bank.

7. The display device of claim 1, wherein a width of the bank is equal to or greater than a width of the black matrix.

8. The display device of claim 1, wherein the plurality of first touch electrodes and the plurality of second touch electrodes are disposed on a top of the plurality of color filters.

9. The display device of claim 1, wherein the plurality of first touch electrodes are arranged to overlap a boundary portion between the plurality of color filters in a first direction, and the plurality of second touch electrodes are arranged to overlap a boundary portion between the plurality of color filters in a second direction which is different from the first direction.

10. The display device of claim 1, further comprising an inorganic insulation layer disposed between the black matrix and the plurality of first touch electrodes, wherein the inorganic insulation layer is disposed on the plurality of first touch electrodes and the plurality of second touch electrodes.

11. The display device of claim 10, further comprising bridge electrodes disposed on a layer different from a layer on which the plurality of first touch electrodes and the plurality of second touch electrodes are disposed, and connected to, through contact portions, the first touch electrodes adjacent to each other, wherein the bridge electrodes intersect the second touch electrodes.

12. The display device of claim 11, wherein the black matrix is disposed on the inorganic insulation layer and the bridge electrodes.

13. The display device of claim 1, wherein the plurality of color filters include a transparent organic layer.

14. The display device of claim 13, wherein the transparent organic layer is formed of one or more of acryl resin, epoxy resin, phenolic resin, polyamide resin and polyimide resin.

15. The display device of claim 1, wherein the substrate is a plastic film or a glass substrate.

16. The display device of claim 1, further comprising,
    a first touch line provided on the substrate and electrically connected to one end of the plurality of first touch electrodes extending in a first direction;
    a pad provided on the substrate; and
    a first touch driver electrically connected with the first touch line through the pad.

17. The display device of claim 16, further comprising a second touch driver, wherein the plurality of second touch electrodes extending in a second direction are connected to a second touch line at one end thereof, and the second touch line is connected to the second touch driver through another pad.

18. The display device of claim 17, wherein the plurality of first touch electrodes receive a driving pulse from the first touch driver through the first touch line, and the second touch driver receives charging variation amounts of touch sensors from the plurality of second touch electrodes, and wherein the touch sensors are disposed respectively in intersection portions of the plurality of first touch electrodes and the plurality of second touch electrodes.

19. The display device of claim 1, further comprising an overcoat layer between the plurality of color filters and the plurality of first touch electrodes and between the plurality of color filters and the plurality of second touch electrodes.

* * * * *